(12) United States Patent
Lin et al.

(10) Patent No.: US 12,388,435 B2
(45) Date of Patent: Aug. 12, 2025

(54) POWER LIMITING CIRCUITS

(71) Applicant: Nuvoton Technology Corporation, Hsinchu Science Park (TW)

(72) Inventors: Chun-Ku Lin, Hsinchu (TW); Jui-Hsiao Hung, Hsinchu (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 148 days.

(21) Appl. No.: 18/170,305

(22) Filed: Feb. 16, 2023

(65) Prior Publication Data

US 2024/0039525 A1  Feb. 1, 2024

(30) Foreign Application Priority Data

Aug. 1, 2022  (TW) .................................. 111128774

(51) Int. Cl.
*H03K 17/082*  (2006.01)
(52) U.S. Cl.
CPC ............................... *H03K 17/0822* (2013.01)
(58) Field of Classification Search
CPC .............. H03K 17/0822; H03K 17/082–0828
See application file for complete search history.

(56) References Cited

U.S. PATENT DOCUMENTS

| | | | |
|---|---|---|---|
| 10,720,768 B2* | 7/2020 | Asanza Maldonado | ..................... H02H 1/04 |
| 11,870,428 B1* | 1/2024 | Cox | ..................... G01R 19/165 |
| 2014/0254048 A1 | 9/2014 | Chiang | |
| 2017/0054438 A1* | 2/2017 | Handy | ..................... H02H 3/05 |
| 2017/0170654 A1* | 6/2017 | Asanza Maldonado | ..................... H03K 17/0822 |
| 2019/0271743 A1 | 9/2019 | Imura et al. | |
| 2019/0393694 A1 | 12/2019 | Venigalla et al. | |

OTHER PUBLICATIONS

An Office Action in corresponding TW Application No. 111128774 dated Jan. 25, 2024 is attached, 6 pages.

* cited by examiner

*Primary Examiner* — Thienvu V Tran
*Assistant Examiner* — Christopher J Clark
(74) *Attorney, Agent, or Firm* — Muncy, Geissler, Olds & Lowe, P.C.

(57) ABSTRACT

A power limiting circuit is provided to control operation power of a power device during operation. The power limiting circuit includes a detection circuit and a control circuit. The detection circuit is coupled to the power device. The detection circuit is configured to detect a cross voltage between an input terminal and an output terminal of the power device and generate at least one detection signal associated with the detected cross voltage. The control circuit is coupled to the detection circuit and the power device. The control circuit is configured to generate a control signal based on the at least one detection signal. The control signal is provided to enable or disable the power device to control the operation power of the power device.

9 Claims, 9 Drawing Sheets

POWER LIMITING CIRCUITS

CROSS REFERENCE TO RELATED APPLICATIONS

This Application claims priority of Taiwan Patent Application No. 111128774, filed on Aug. 1, 2022, the entirety of which is incorporated by reference herein.

BACKGROUND OF THE INVENTION

Field of the Invention

The present invention relates to a current limiting circuit, and more particularly to a current limiting circuit for a power device.

Description of the Related Art

One characteristic of power devices is that they are high-voltage tolerant, and as such are ideal for use in energy conversion circuits of electronic devices, such as circuits for frequency conversion, rectification, voltage transformation, or power amplification. When a cross voltage between an input terminal and an output terminal of a power device (such as a drain-source voltage (Vds) of a power transistor) is large, the load current flowing through the power device results in a larger amount of power. Where high power is maintained for an extended period of time, thermal energy is generated, which induces a high temperature. Under long-term use, the high power may cause the power device to be damaged.

BRIEF SUMMARY OF THE INVENTION

The present invention provides a power limiting circuit for a power device performing a current and voltage detection, which may reduce a load current flowing through the power device when an input-output voltage of the power device is great, thereby limiting the operation power of the power device.

An exemplary embodiment of the present invention provides a power limiting circuit for controlling an operation power of the power device during operation. The power limiting circuit comprises a detection circuit and a control circuit. The detection circuit is coupled to the power device. The detection circuit is configured to detect a cross voltage between an input terminal and an output terminal of the power device and generate at least one detection signal associated with the detected cross voltage. The control circuit is coupled to the detection circuit and the power device. The control circuit is configured to generate a control signal based on the at least one detection signal. The control signal is provided to enable or disable the power device to control the operation power of the power device.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated model of carrying out the invention. This description is made for the purpose of illustrating the general principles of the invention and should not be taken in a limiting sense. The scope of the invention is best determined by reference to the appended claims.

Figure 1:
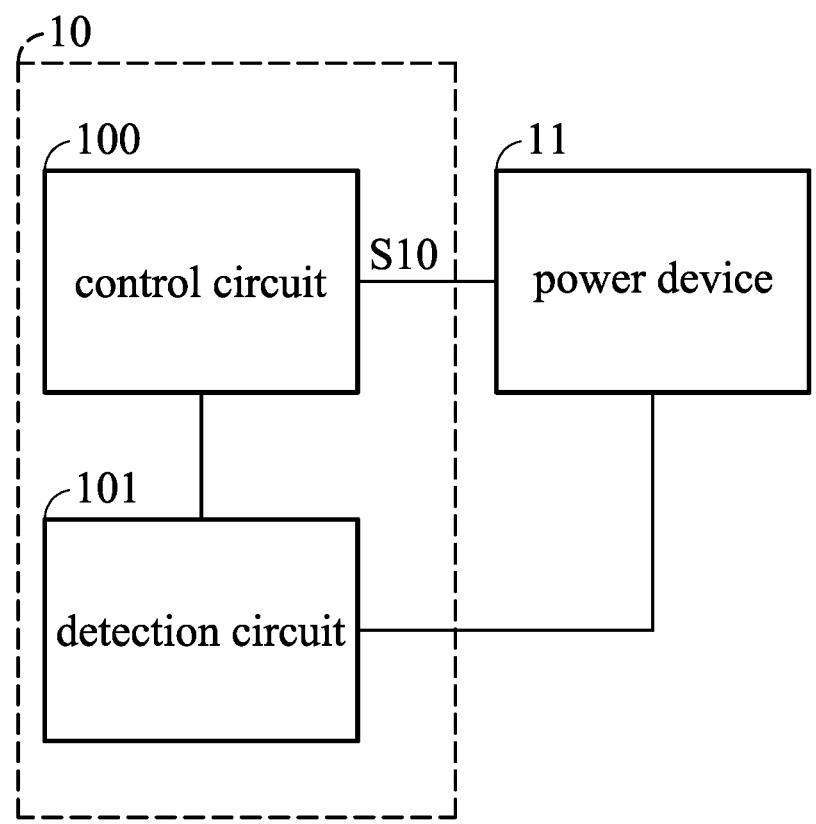
FIG. 1 shows an electronic device having a power limiting function according to an embodiment of the present invention.

FIG. 1 shows an electronic device with a power limiting function according to an embodiment of the present invention. Referring to FIG. 1, an electronic device 1 comprises a power limiting circuit 10 and a power device 11. In the embodiment, the power device 11 is a high-voltage-tolerant device. The power limiting circuit 10 detects the voltage across an input terminal and an output terminal of the power device 11 and further detects the load current flowing through the power device 11. The power limiting circuit 10 controls the operation power of the power device 11 based on the detection results.

Referring to FIG. 1, the power limiting circuit 10 comprises a control circuit 100 and a detection circuit 101. The detection circuit 101 is coupled to the power device 11 to detect a cross voltage between the input terminal and the output terminal of the power device 11 and further detect the load current flowing through the power device 11. The detection circuit 101 generates at least one detection signal based on the detection results. In the embodiment, the detection signal may be a current signal, which is associated with the cross voltage between the input terminal and the output terminal of the power device 11. For example, the detection circuit 101 generates two currents based on the detection results as two detection signals. Of the two detection signals, one indicates the detected cross voltage of the power device 11, and the other indicates the detected load current. Since the load current is the current flowing through the power device 11, the load current is associated with the above-mentioned cross voltage of the power device 11. Accordingly, one or more detection signals generated by the detection circuit 101 are all associated with the above-mentioned cross voltage of the power device 11.

The control circuit 100 generates a control signal S10 to enable or disable the power device 11, for example, to turn the power device 11 on or off. The control circuit 100 also receives the detection signals generated by the detection circuit 101 and adjusts the duty cycle of the control signal S10 based on the detection signals, thereby adjusting the on-time of the power device 11. By adjusting the on-time of the power device 11, the load current flowing through the power device 11 is controlled, which accomplishes the control of the operation power of the power device 11 (the operation power is equal to the product of the above-mentioned cross voltage and the load current).

Through the above-mentioned operation, when the above-mentioned cross voltage of the power device 11 is large, the power limiting circuit 1 can shorten the on-time of the power device 11 to reduce the load current, so that the operation power of the power device 11 is controlled to remain at a predetermined fixed value. Therefore, the power limiting current 1 of the present application can control the operation power of the power device 11 to remain at a predetermined fixed value, thereby preventing the power device 11 from being damaged due to a large cross voltage.

Various embodiments of the power limiting circuit 10 of the present invention will be described below.

Figure 2:
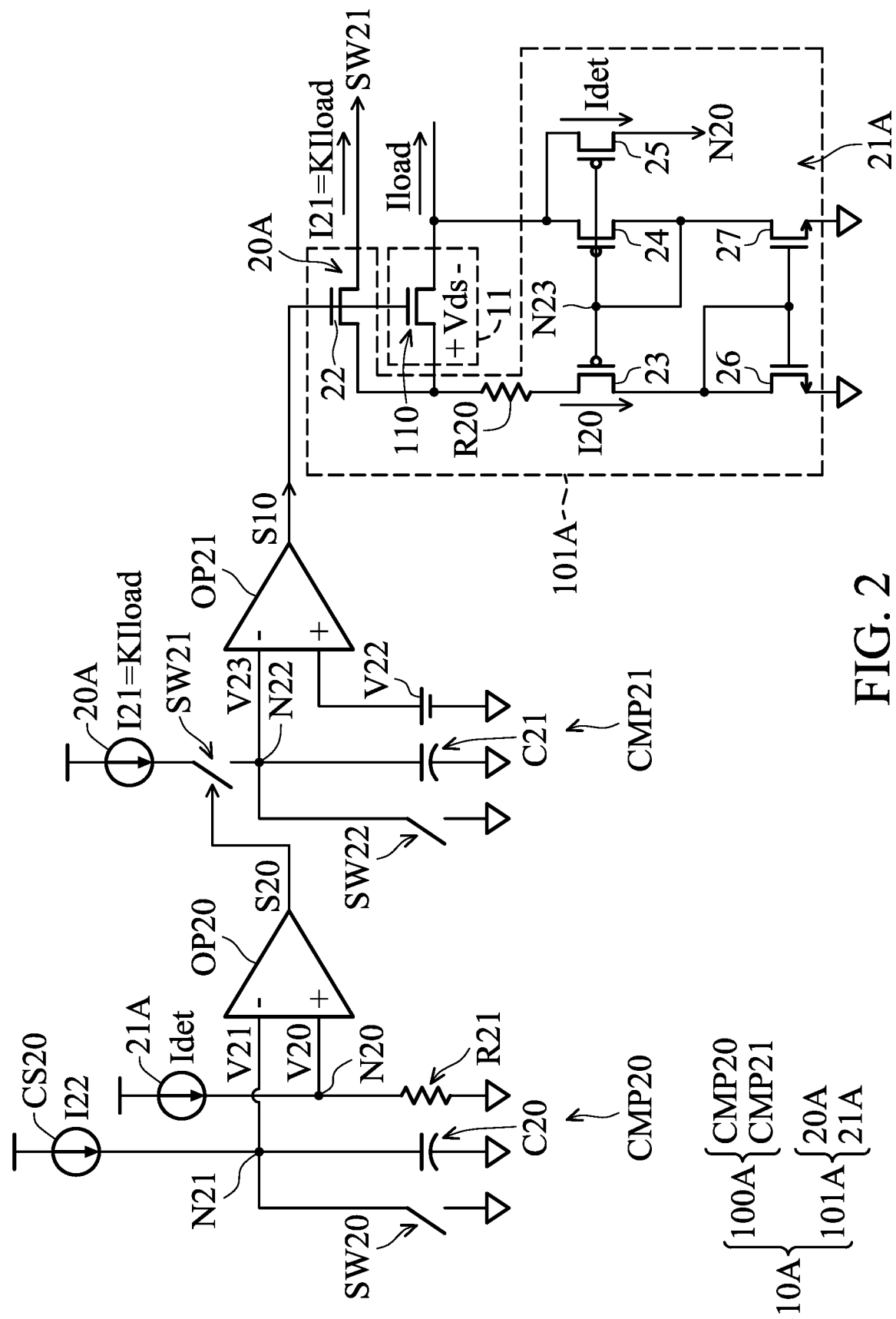
FIG. 2 shows a power limiting circuit according to an embodiment of the present invention.

FIG. 2 shows a power limiting circuit according to an embodiment of the present invention. The power limiting circuit 10 of FIG. 1 can be implemented by the power limiting circuit 10A of FIG. 2. Referring to FIG. 2, in order to clearly illustrate the operation of the power limiting circuit, FIG. 2 not only shows the power limiting circuit 10A, but also shows the power device 11 coupled to the power limiting circuit 10A. The power limiting circuit comprises a control circuit 100A and a detection circuit 101A. The control circuit 100 and the detection circuit 101 in FIG. 1 can be implemented by the control circuit 100A and the detection circuit 101A in FIG. 2 respectively.

As shown in FIG. 2, the power device 11 may be implemented by an N-type metal-oxide-semiconductor (NMOS) transistor 110. The detection circuit 101A comprises a current detection circuit 20A and a voltage detection circuit 21A. The current detection circuit comprises an NMOS transistor 22. The voltage detection circuit 21A comprises P-type metal-oxide-semiconductor (PMOS) transistors 23-25, NMOS transistors 26 and 27, and a resistor R20. In the embodiment, each MOS transistor comprises three electrode terminals, including an input terminal, an output terminal, and a control terminal. For an NMOS transistor, the input terminal, the output terminal, and the control terminal are the drain, the source, and the gate, respectively; for a PMOS transistor, the input terminal, the output terminal, and the control terminal are the source, the drain, and the gate respectively. In the embodiment, the drain of the NMOS transistor 110 serves as the input terminal of the power device 11, and the source of the NMOS transistor 110 serves as the output terminal of the power device 11.

Referring to FIG. 2, the gate of the NMOS transistor 110 receives the control signal S10 generated by the control circuit 100A. The gate of the NMOS transistor 22 of the current detection circuit 20A receives the control signal S10, the drain thereof is coupled to the drain of the NMOS transistor 110, and the source thereof is coupled to a comparison circuit CMP21. The size of NMOS transistor 22 is K times that of NMOS transistor 110. In detail, the width-to-length ratio of the gate of the NMOS transistor 22 is K times (K W/L) the width-to-length ratio (W/L) of the gate of the NMOS transistor 110.

The first terminal of the resistor R20 is coupled to the drain of the NMOS transistor 110. The source of the PMOS transistor 23 is coupled to the second terminal of the resistor R20, and the gate of the PMOS transistor 23 is coupled to a node N23. The drain and gate of the NMOS transistor 26 are coupled to the drain of the PMOS transistor 23, and the source thereof is coupled to a reference terminal, such as a ground terminal (represented by an inverted triangle in the figures). The source of the PMOS transistor 24 is coupled to the source of the NMOS transistor 110, and the gate and drain thereof are coupled to the node N23. The drain of the NMOS transistor 27 is coupled to the gate and the drain of the PMOS transistor 24 (that is, the drain of the NMOS transistor 27 is also coupled to the node N23), and the gate thereof is coupled to the gate and the drain of the NMOS transistor 26, and the source thereof is coupled to the ground terminal. The source of the PMOS transistor 25 is coupled to the source of the NMOS transistor 110, the gate thereof is coupled to the node N23, and the drain thereof is coupled to a comparison circuit CMP20 at a node N20.

The comparison circuits CMP20 and CMP21 is included in the control circuit 100A. The comparison circuit CMP20 comprises a comparator OP20, a capacitor C20, a switch SW20, a resistor R21, and a current source CS20. The comparator OP20 has an inverting input terminal (−), a non-inverting input terminal (+), and an output terminal. The inverting input terminal (−) of the comparator OP20 is coupled to a node N21, and the non-inverting input terminal (+) thereof is coupled to the node N20. The comparison circuit CMP20 is coupled to the voltage detection circuit 21A at the node N20. The current source CS20 is coupled to the node N21 and provides a current I22 to the node N21. The capacitor C20 is coupled between the node N21 and the ground terminal. The switch SW20 is coupled between the node N21 and the ground terminal. The resistor R21 is coupled between the node N20 and the ground terminal. The output terminal of the comparator OP20 generates a comparison signal S20.

The comparison circuit CMP21 comprises a comparator OP21, switches SW21 and SW22, and a capacitor C22. The comparator OP21 has an inverting input terminal (−), a non-inverting input terminal (+), and an output terminal. The inverting input terminal (−) of the comparator OP21 is coupled to a node N22, and the non-inverting input terminal (+) thereof receives a reference voltage V22. The input terminal of the switch SW21 is coupled to the current detection circuit 20A, and the output terminal thereof is coupled to the node N22. The switch SW21 receives the comparison signal S20 from the comparison circuit CMP20 to determine its on/off state. The switch SW22 is coupled between the node N22 and the ground terminal. The capacitor C21 is coupled between the node N22 and the ground terminal. The control signal S10 is generated at the output terminal of the comparator OP21.

The detailed operation of the power limiting circuit 10A of FIG. 2 will be described in detail below.

Figure 3B:
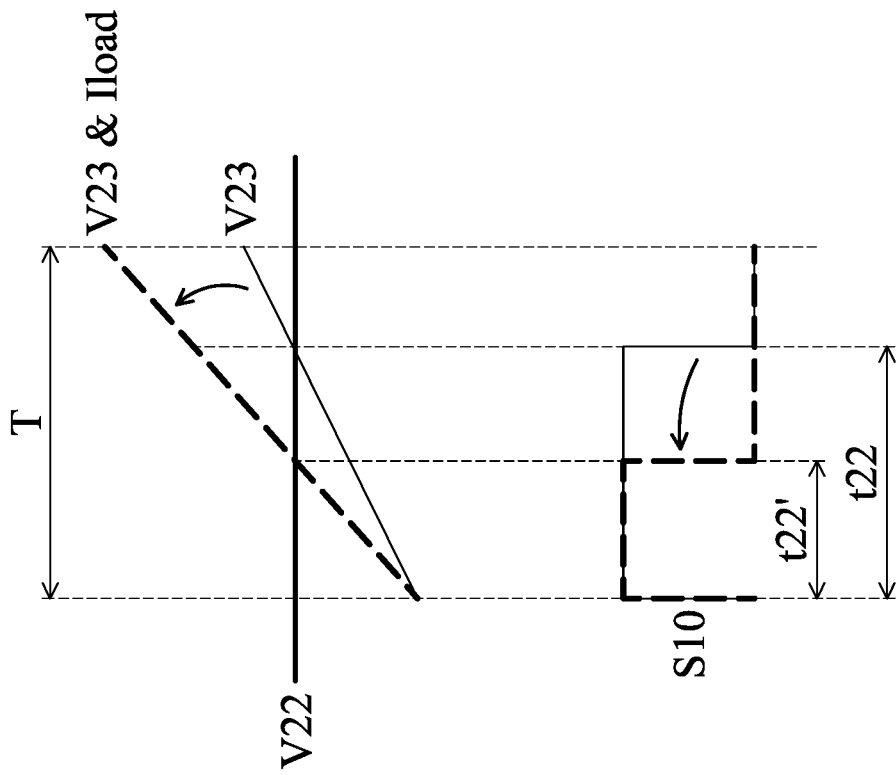
FIGS. 3A-3B are schematic diagrams showing changes in main signals and voltages of the power limiting circuit of FIG. 2.
Figure 3A:
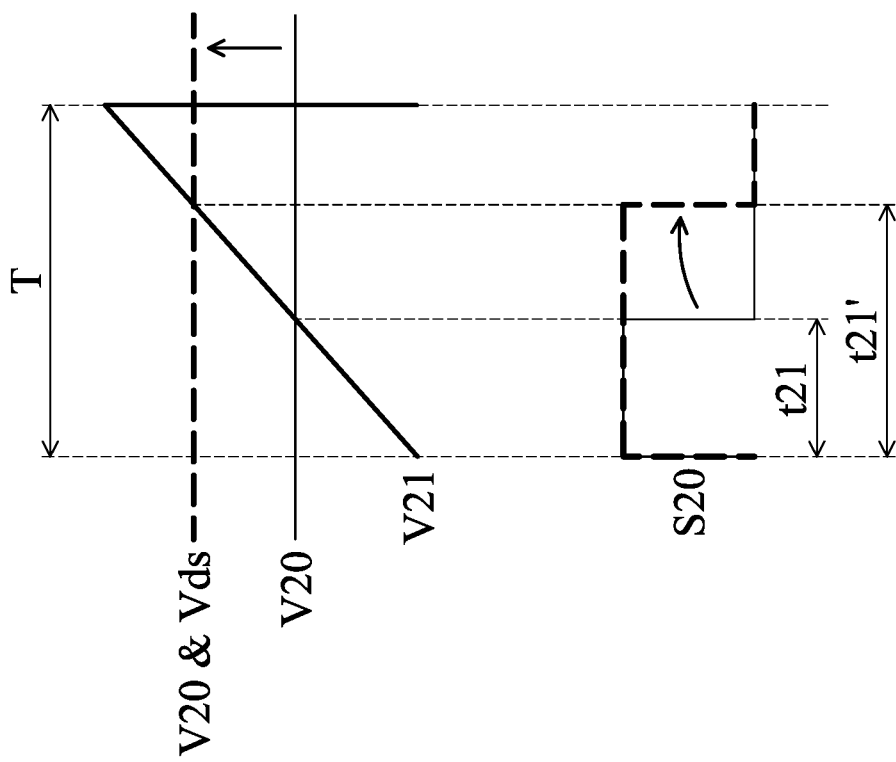

Referring to FIG. 2 and FIG. 3A, when the electronic device operates, the NMOS transistor 110 and the NMOS transistor 22 are turned on based on the high level of the control signal S10. At this time, based on the high level of the control signal S10, there is a cross voltage Vds (drain-source voltage) between the drain and the source of the NMOS transistor 110, and a load current Iload flows through the NMOS transistor 110. The voltage detection circuit 21A generates a current I20 (I20=Vds/r20) based on the resistance value r20 of the resistor R20 and the cross voltage Vds. Through the operation of the current mirror circuit composed of the transistors 23-25 in the voltage detection circuit 21A, a mirrored current Idet flowing through the PMOS transistor 25 is obtained. In the embodiment, the current Idet is equal to the current I20. The current Idet is a detection signal generated by the voltage detection circuit 21A, which is provided to the node N20 of the comparison circuit CMP20 as an input signal of the control circuit 100A.

Accordingly, the voltage detection circuit 21A can be regarded as a current source for generating the current Idet. In order to clearly show the relationship between the voltage detection circuit 21A and the comparison circuit CMP20, in FIG. 2, the voltage detection circuit 21A is represented by the symbol of a current source that is coupled to the node N20 and provides the current (detection signal) Idet.

In addition, when the electronic device operates, the time when the control signal S10 is at the high level is t22. The NMOS transistor 22 of the current detection circuit 20A is turned on based on the high level of the control signal S10. Since the size of the NMOS transistor 22 is K times that of the NMOS transistor 110, the generated current I21 flowing through the NMOS transistor 22 is equal to K times the load current Iload, that is, I21=KIload. The current I21 serves as a detection signal generated by the current detection circuit 20A, which is provided to the comparison circuit CMP21 as another input signal of the control circuit 100A. In order to clearly show the relationship between the current detection circuit 20A and the comparison circuit CMP21, in FIG. 2, the current detection circuit 20A is represented by the symbol of a current source that is coupled to the switch SW21 and provides the current (detection signal) I21.

When the electronic device operates, the switches SW20 and SW22 are turned on simultaneously to reset the voltages on the nodes N21 and N22 respectively, and then the switches SW20 and SW22 are turned off for a period of time T. As shown in FIG. 3A, current I22 charges capacitor C20, and a ramp voltage V21 is thus generated at the node N21. An input voltage V20 is generated at the node N20 based on the resistance value r21 of the resistor R21 and the current Idet provided to the node N20. The comparator OP20 compares the input voltage V20 with the ramp voltage V21 to generate a comparison signal S20 based on the comparison result. Referring to FIG. 3A, when the input voltage V20 is greater than the ramp voltage V21, the comparison signal S20 is at a high level. Once the input voltage V20 becomes less than the ramp voltage V21, the comparison signal S20 is switched to a low level.

Referring to FIG. 2 and FIG. 3A, the comparison signal S20 is at the high level during time t21, and the switch SW21 is turned on based on the high level of the comparison signal S20. Since switch SW21 is turned on, the current I21 charges the capacitor C21, and an input voltage V23 is thus generated at the node N22. The current I21 continues to charge the capacitor C21 until the comparison signal S20 switches to the low level. As shown in FIG. 3B, the input voltage V23 gradually increases. The comparator OP21 compares the input voltage V23 with the reference voltage V22 to generate the control signal S10 based on the comparison result. When the reference voltage V22 is greater than the input voltage V23, the control signal S10 is at a high level. Once the reference voltage V22 becomes less than the input voltage V23, the control signal S10 is switched to a low level. Referring to FIG. 3B, when the control signal S10 is at the high level during time t22, the NMOS transistor 110 and the NMOS transistor 22 are turned on based on the high level of the control signal S10; when the control signal S10 is switched to the low level, the NMOS transistor 110 and the NMOS transistor 22 are turned off.

During the operation of the electronic device, when the cross voltage Vds of the NMOS transistor 110 increases, both the current I20 and the load current Iload that are generated based on the cross voltage Vds increase. Therefore, the operation power P (P=Iload×Vds) of the NMOS transistor 110 increases. An increase in the current I20 results in an increase in the obtained current Idet. Therefore, the input voltage V20 at the node N20 increases with the cross voltage Vds, that is, the input voltage V20 is proportional to the cross voltage Vds (V20∝cVds). Referring to FIG. 3A, the level of the input voltage V20 is raised upward, as indicated by the arrow. As the input voltage V20 increases, the time t21 when the input voltage V20 is greater than the ramp voltage V21 is extended to time t21', so that the period during which the comparison signal S20 is at the high level is extended, that is, the duty cycle of the comparison signal S20 increases.

Based on the extended period of the high level of the comparison signal S20 and the increase of the load current Iload, the input voltage V23 at the node N22 increase more rapidly, that is, the rising slope of the input voltage V23 is proportional to the load current Iload (V23∝Iload). Referring to FIG. 3B, the rising slope of the input voltage V23 increases as indicated by the arrow. As the rising slope of the input voltage V23 increases, the time t22 when the reference voltage V22 is greater than the input voltage V23 is shortened to time t22', so that the period during which the control signal S10 is at the high level is shortened, that is, the duty cycle of the control signal S10 decreases.

Based on the decrease of the duty cycle of the control signal S10, the on-time of the NMOS transistor (power device) 110 is shortened, so that the load current Iload is reduced. As such, the operation power of the NMOS transistor 110 can decreases accordingly. According to the embodiment, when the operation power of the NMOS transistor 110 increases, the operation power decreases by shortening the on-time of the NMOS transistor 110 to avoid damage to the NMOS transistor 110 caused by high power.

After the duty cycle of the control signal S10 is adjusted once, the switches SW20 and SW22 are turned on to discharge the capacitors C20 and C21 to reset the voltage V21 at the node N21 and the voltage V23 at the node N22, respectively.

In the embodiment of the present invention, the power limiting circuit 10A can limit the operation power of the NMOS transistor 110 to a predetermined value. For example, when the power limiting circuit 10A detects that the operation power of the NMOS transistor 110 increases, the operation power can decrease to a predetermined value by shortening the on-time of the NMOS transistor 110. The predetermined value can be determined by the resistance value r20 of the resistor R20, the capacitance value c20 of the capacitor C20, the current I22, the resistance value r21 of the resistor R21, the capacitance value c21 of the capacitor C21, the reference voltage V22, and the multiple K of the size of the NMOS transistor 22 relative to the size of the NMOS transistor 110. The detailed analysis is described below.

When the electronic device operates, the NMOS transistor 110 has a cross voltage Vds. The current I20 can be expressed as:

$$I20 = Vds/r20 \qquad \text{Equation (1)}$$

Since the current Idt is equal to the current I20, Equation (1) can be rewritten as:

$$Idet = Vds/r20 \qquad \text{Equation (2)}$$

Based on Equation (2), the input voltage V20 can be obtained:

$$V20 = r21 \times Vds/r20 \qquad \text{Equation (3)}$$

The current I22 charges the capacitor C20 during the time t21. The charge quantity Q20 corresponding to the period t21 can be expressed as:

$$Q20=I22\times t21=c20\times V21 \qquad \text{Equation (4)}$$

When the ramp voltage V21 is equal to the input voltage V20 (V21=V20), the time t21 can be obtained:

$$t21=c20\times r21\times (Vds/r20)/I22 \qquad \text{Equation (5)}$$

Referring to Equation (3) and Equation (5), r21×(Vds/r20) in Equation (5) is equal to the input voltage V20. Therefore, when the cross voltage Vds increases, the input voltage V20 increases accordingly, so that the time t21 also increases, which extends the time when the comparison signal S20 is at the high level. As a result, the time when the capacitor C21 is changed by the current I21 is also extended. The amount of charge Q21 used to charge the capacitor C21 can be expressed as:

$$Q21=I21\times t21=c21\times V23 \qquad \text{Equation (6)}$$

Wherein, I21=KIload, and Equation (6) is rewritten as:

$$Q21=KIload\times t21=c21\times V23 \qquad \text{Equation (7)}$$

When the input voltage V23 is equal to the reference voltage V22 (V23=V22), Equation (5) is taken into Equation (7) to obtain Equation (8):

$$KIload\times c20\times r21\times (Vds/r20)/I22=c21\times V22 \qquad \text{Equation (8)}$$

Equation (8) is rewritten as follows:

$$Iload\times Vds=(c21\times V22\times I22\times r20)/(K\times c20\times r21) \qquad \text{Equation (9)}$$

Equation (9) represents the operation power P of the NMOS transistor 110 (P=load×Vds). Since the parameters c21, V22, I22, r20, K, c20, and r21 in Equation (9) are all constant values, the predetermined value of the operation power can be determined by adjusting at least one of these parameters.

Figure 4:
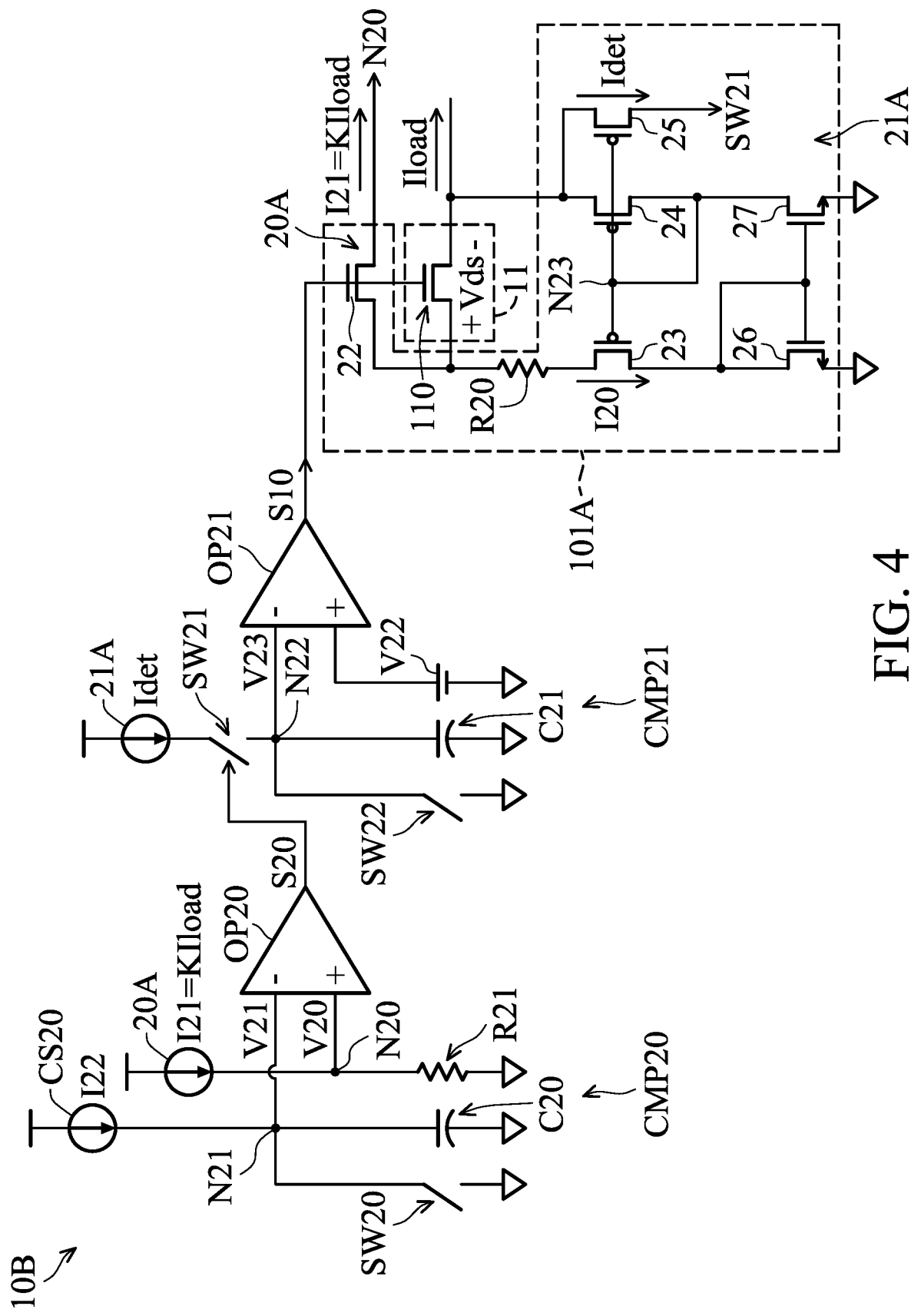
FIG. 4 shows a power limiting circuit according to another embodiment of the present invention.

FIG. 4 shows a power limiting circuit according to another embodiment of the present invention. The power limiting circuit 10 of FIG. 1 can be implemented by the power limiting circuit 10B of FIG. 4. The circuit structure of the power limiting circuit 10B is substantially the same as that of the power limiting circuit 10A in FIG. 2. The only difference between the power limiting circuits 10B and 10A is that the current I21 (a detection signal) generated by the current detection circuit 20A is provided to the node N20 of the comparator circuit CMP20 as an input signal of the control circuit 100A and the current Idet (another detection signal) generated by the voltage detection circuit 21A is provided to the comparison circuit CMP21 as another input signal of the control circuit 100A. The circuit structure and operation of the power limiting circuit 10B are as described in the embodiment of FIG. 2 and thus omitted here.

Figure 5:
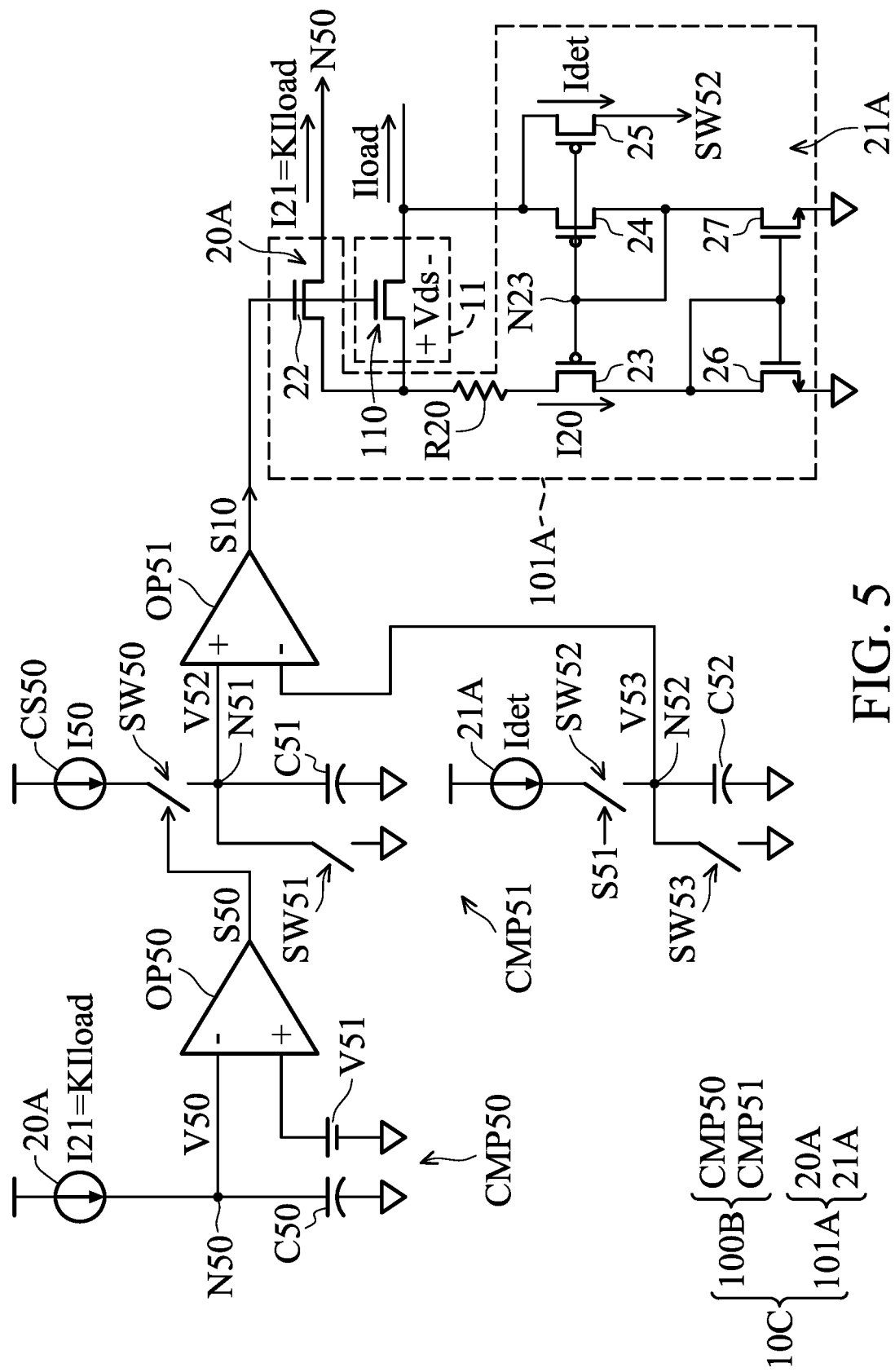
FIG. 5 shows a power limiting circuit according to another embodiment of the present invention.

FIG. 5 shows a power limiting circuit according to another embodiment of the present invention. The power limiting circuit 10 of FIG. 1 can be implemented by the power limiting circuit 10C of FIG. 5. Referring to FIG. 5, in order to clearly illustrate the operation of the power limiting circuit, FIG. 5 not only shows the power limiting circuit 10C, but also shows the power device 11 and the transistor 110 coupled to the power limiting circuit 10C. The power limiting circuit 10C comprises a control circuit 100B and a detection circuit 101A. The control circuit 100 and the detection circuit 101 in FIG. 1 can be implemented by the control circuit 100B and the detection circuit 101A in FIG. 5, respectively. The control circuit 100B comprises comparison circuits CMP50 and CMP51.

The circuit structure and operation of the power device 11 and the detection circuit 101A are the same as those in FIG. 2. For related descriptions, please refer to the relevant paragraphs in FIG. 2, and the description is omitted here.

Referring to FIG. 5, the source of the NMOS transistor 22 is coupled to the comparison circuit CMP50 at a node N50, and the current I21 is provided to the node N50 of the comparison circuit CMP50 as an input signal of the control circuit 100B. The source of the PMOS transistor 25 is coupled to the comparison circuit CMP51, and the current Idet is provided to the comparison circuit CMP51 as another input signal of the control circuit 100B.

The comparison circuit CMP50 comprises a comparator OP50 and a capacitor C50. The comparator OP50 has an inverting input terminal (−), a non-inverting input terminal (+), and an output terminal. The inverting input terminal (−) of the comparator OP50 is coupled to the node N50, and the non-inverting input terminal (+) thereof receives a reference voltage V51. The comparison circuit CMP50 is coupled to the current detection circuit 20A at the node N50. The capacitor C50 is coupled between the node N50 and the ground terminal (represented by an inverted triangle in the figures). The output terminal of the comparator OP50 generates a comparison signal S50.

The comparison circuit CMP51 comprises a comparator OP51, switches SW50-SW53, capacitors C51 and C52, and a current source CS50. The comparator OP51 has an inverting input terminal (−), a non-inverting input terminal (+), and an output terminal. The non-inverting input terminal (+) of the comparator OP51 is coupled to a node N51, and the inverting input terminal (−) thereof is coupled to a node N52. The current source CS50 provides a current I50. The input terminal of the switch SW50 is coupled to the current source CS50, and the output terminal thereof is coupled to the node N51. The switch SW50 receives the comparison signal S50 from the comparison circuit CMP50 to determine its on/off state. The switch SW51 is coupled between the node N51 and the ground terminal. The capacitor C51 is coupled between the node N51 and the ground terminal. The input terminal of the switch SW52 is coupled to the voltage detection circuit 21A, and the output terminal thereof is coupled to the node N52. The switch SW52 receives a switching signal S51 to determine its on/off state. The switch SW53 is coupled between the node N52 and the ground terminal. The capacitor C52 is coupled between the node N52 and the ground terminal. The control signal S10 is generated at the output terminal of the comparator OP21.

The detailed operation of the power limiting circuit 10C of FIG. 5 will be described in detail below.

Figure 6B:
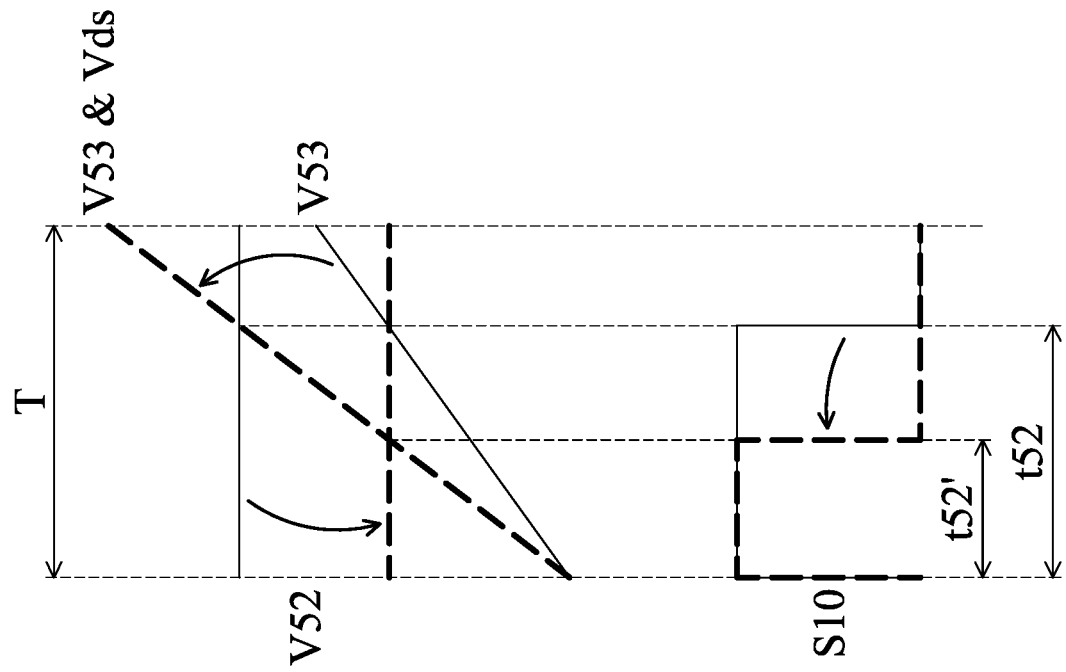
FIGS. 6A-6B show schematic diagrams showing changes in main signals and voltages of the power limiting circuit of FIG. 5.
Figure 6A:
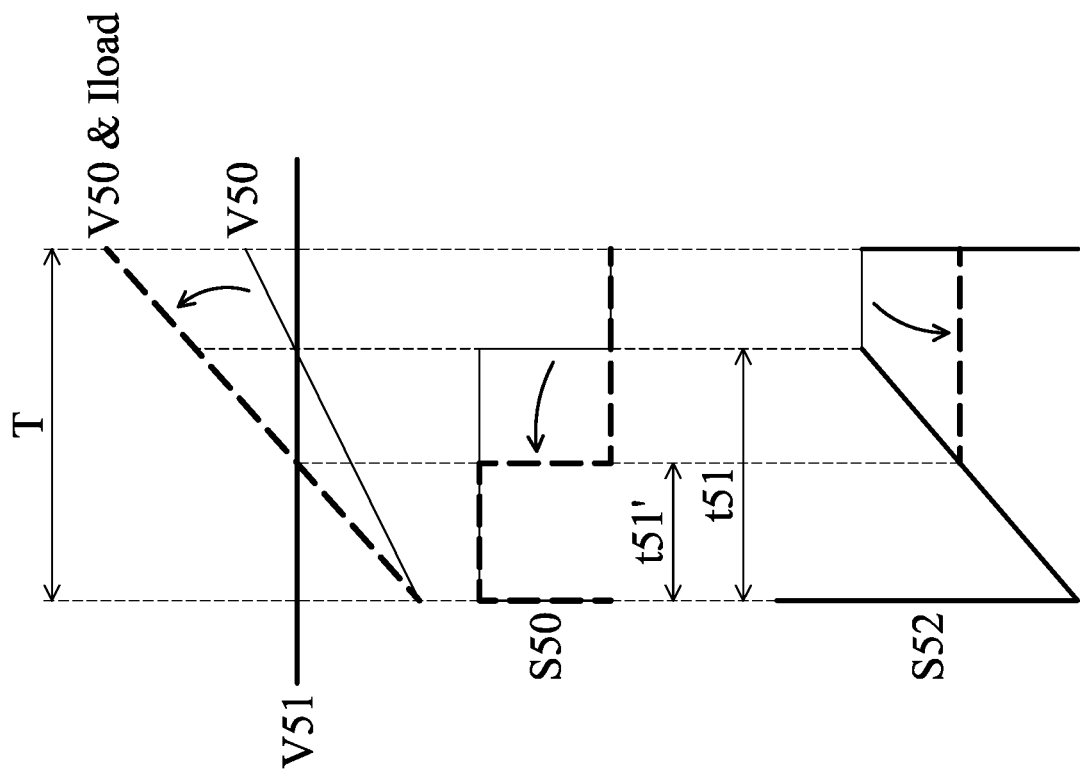

When the electronic device operates, the operations of the NMOS transistor 110, the current detection circuit 20A, and the voltage detection circuit 21A are as described in the embodiment of FIG. 2, and the detailed description will be omitted below. Referring to FIG. 5 and FIG. 6A, when the electronic device operates, the current detection circuit 20A generates the current I21. The current I21 is a detection signal generated by the current detection circuit 20A, which is provided to the node N50 of the comparison circuit CMP50 as one input signal of the control circuit 100B. In addition, when the electronic device operates, the voltage detection circuit 21A generates the current Idet. The current Idet is a detection signal generated by the voltage detection circuit 21A, which is provided to the comparison circuit CMP51 as another input signal of the control circuit 100B.

As shown in FIG. 6A, when the electronic device operates, the current I21 charges the capacitor C50, and an input voltage V50 is thus generated at the node N50. As shown in FIG. 6A, the input voltage V50 gradually increases. The comparator OP50 compares the input voltage V50 with the reference voltage V51 to generate a comparison signal S50 based on the comparison result. When the reference voltage V51 is greater than the input voltage V50, the control signal S50 is at a high level. Once the reference voltage V51 becomes less than the input voltage V50, the control signal S50 is switched to a low level.

Referring to FIGS. 5 and 6A, when the electronic device operates, the switches SW51 and SW53 are simultaneously turned on to reset the voltages at the nodes N51 and N52, respectively, and then the switches SW51 and SW53 are turned off for a period of time T. The comparison signal S50 is at the high level during time t51, and the switch SW50 is turned on based on the high level of the comparison signal S50. Since the switch SW50 is turned on, the current I50 charges capacitor C51, and a reference voltage V52 is thus generated at the node N51. As shown in FIG. 6A, the reference voltage V52 gradually increases. When the switch SW50 is turned off based on the low level of the comparison signal S50 after the time t51, the reference voltage V52 stops increasing and remains at the last reached level (referred to as a "holding level"). When the reference voltage V52 reaches the above-mentioned holding level, the switch SW52 is turned on. Since the switch SW52 is turned on, the current Idet charges capacitor C52, and an input voltage V53 is thus generated at the node N52. As shown in FIG. 6B, the input voltage V53 gradually increases. In the embodiment, the time when the switch SW52 is turned on is later than the time when the switch SW50 is turned on, so that the reference voltage V52 starts to increase earlier than the voltage V53. In another embodiment, the switch SW52 may be turned on at the same time as the switch SW50. The comparator OP51 compares the input voltage V53 with the reference voltage V52 to generate the control signal S10 based on the comparison result. When the reference voltage V52 is greater than the input voltage V53 (that is, the holding level of the reference voltage V52 is higher than the level of the input voltage V53), the control signal S10 is at the high level. Once the reference voltage V52 becomes less than the input voltage V53 (that is, the holding level of the reference voltage V52 is lower than the level of the input voltage V53), the control signal S10 is switched to the low level. Referring to FIG. 6B, when the control signal S10 is at the high level at the time t52, the NMOS transistor 110 and the NMOS transistor 22 are turned on based on the high level of the control signal S10; when the control signal S10 is switched to the low level, the NMOS transistor 110 and the NMOS transistor 22 are turned off.

During the operation of the electronic device, when the cross voltage Vds of the NMOS transistor 110 increases, both the current I20 and the load current Iload that are generated based on the cross voltage Vds increase. Therefore, the operation power P (P=Ioad×Vds) of the NMOS transistor 110 increases. Based on the increase of the load current Iload, the input voltage V50 at the node N50 increases more rapidly, that is, the rising slope of the input voltage V50 is proportional to the load current Iload (V50∝Iload). Referring to FIG. 6A, the rising slope of the input voltage V50 increases as indicated by the arrow. As the rising slope of the input voltage V50 increases, the time t51 when the reference voltage V51 is greater than the input voltage V50 is shortened to time t51', so that the period during which the comparison signal S50 is at the high level is shortened, that is, the duty cycle of the comparison signal S50 decreases.

As shown in FIGS. 6A and 6B, based on the shortened period during which the comparison signal S50 is at the high level, the capacitor C51 is charged in a shorter time, so that the holding level of the reference voltage V52 is lowered, as indicated by the arrow. In addition, since the current Idet increases due to the increase of the cross voltage Vds, the input voltage V53 at the node N52 increases more rapidly, that is, the rising slope of the input voltage V53 is proportional to the cross voltage Vds (V53∝Vds). Referring to FIG. 6B, the level of the input voltage V53 is raised upward, as indicated by the arrow. Since the holding level of the reference voltage V52 decreases and the rising slope of the input voltage V53 increases, the time t52 when the reference voltage V52 is greater than the input voltage V53 is shortened to time t52', so that the period during which the control signal S10 is at the high level is shortened, that is, the duty cycle of the control signal S10 decreases.

Based on the decrease of the duty cycle of the control signal S10, the on time of the NMOS transistor (power device) 110 is shortened, so that the load current Iload is reduced. Accordingly, the operation power of the NMOS transistor 110 can decreases. According to the embodiment, when the operation power of the NMOS transistor 110 increases, the operation power decreases by shortening the on-time of the NMOS transistor 110 to avoid damage to the NMOS transistor 110 caused by high power.

After the duty cycle of the control signal S10 is adjusted once, the switches SW51 and SW53 are turned on to discharge the capacitors C51 and C52 to reset the voltage V52 at the node N51 and the voltage V53 at the node N52, respectively.

In the embodiment of the present invention, the power limiting circuit 10C can limit the operation power of the NMOS transistor 110 to a predetermined value. For example, when the power limiting circuit 10C detects that the operation power of the NMOS transistor 110 increases, the operation power can decrease to a predetermined value by shortening the on-time of the NMOS transistor 110. The predetermined value can be determined by the resistance value r20 of the resistor R20, the capacitance value c50 of the capacitor C50, the current I50, the reference voltage V51, the capacitance value c51 of the capacitor C51, the capacitance value c52 of the capacitor C52, the time T, and the multiple K of the size of the NMOS transistor 22 relative to the size of the NMOS transistor 110. The detailed analysis is described below.

When the electronic device operates, the current I21 charges the capacitor C50 at the time t51. The charge quantity Q50 corresponding to the period t51 can be expressed as:

$$Q50 = I21 \times t51 = KI\text{load} \times t51 = c50 \times V50 \qquad \text{Equation (10)}$$

When the input voltage V50 is equal to the reference voltage V51 (V50=V51), the time t51 can be obtained:

$$t51 = c50 \times V51 / KI\text{load} \qquad \text{Equation (11)}$$

According to Equation (11), when the cross voltage Vds increases, the current I21 (=KIload) increases accordingly, so that the time t51 decreases, which shortens the time when the comparison signal S50 is at the high level. As a result, the time when the capacitor C51 is charged by the current I50 is also shortened. The amount of charge Q51 used to charge the capacitor C51 can be expressed as:

$$Q51 = I50 \times t51 = c51 \times V52 \qquad \text{Equation (12)}$$

The reference voltage V52 can be obtained according to Equation (12):

$$V52 = I50 \times t51 / c51 \qquad \text{Equation (13)}$$

Equation (11) is taken into Equation (13) to obtain:

$$V52 = (I50/c51) \times c50 \times V51 / KI\text{load} \qquad \text{Equation (14)}$$

The current Idet charges the capacitor C52 at the time T. The amount of charge Q52 used to charge the capacitor C52 can be expressed as:

$$Q52 = c52 \times V53 = T \times Idet = T \times (Vds/r20) \qquad \text{Equation (15)}$$

Based on Equation (15), the input voltage V53 can be obtained:

$$V53 = T \times (Vds/r20)/c52 \qquad \text{Equation (16)}$$

When the reference voltage V52 is equal to the input voltage V53, Equation (17) can be obtained:

$$(I50/c51) \times c50 \times V51/K\!I\text{load} = T \times (Vds/r20)/c52 \qquad \text{Equation (17)}$$

Equation (17) is rewritten as:

$$I\text{load} \times Vds = (I50 \times c50 \times V51) \times (r20 \times c52)/(c51 \times T \times K) \qquad \text{Equation (18)}$$

Equation (18) represents the operation power P of the NMOS transistor 110 (P=Iload×Vds). Since the parameters I50, c50, V51, r20, c52, c51, T, and K in Equation (19) are all constant values, the predetermined value of the operation power can be determined by adjusting at least one of these parameters.

Figure 7:
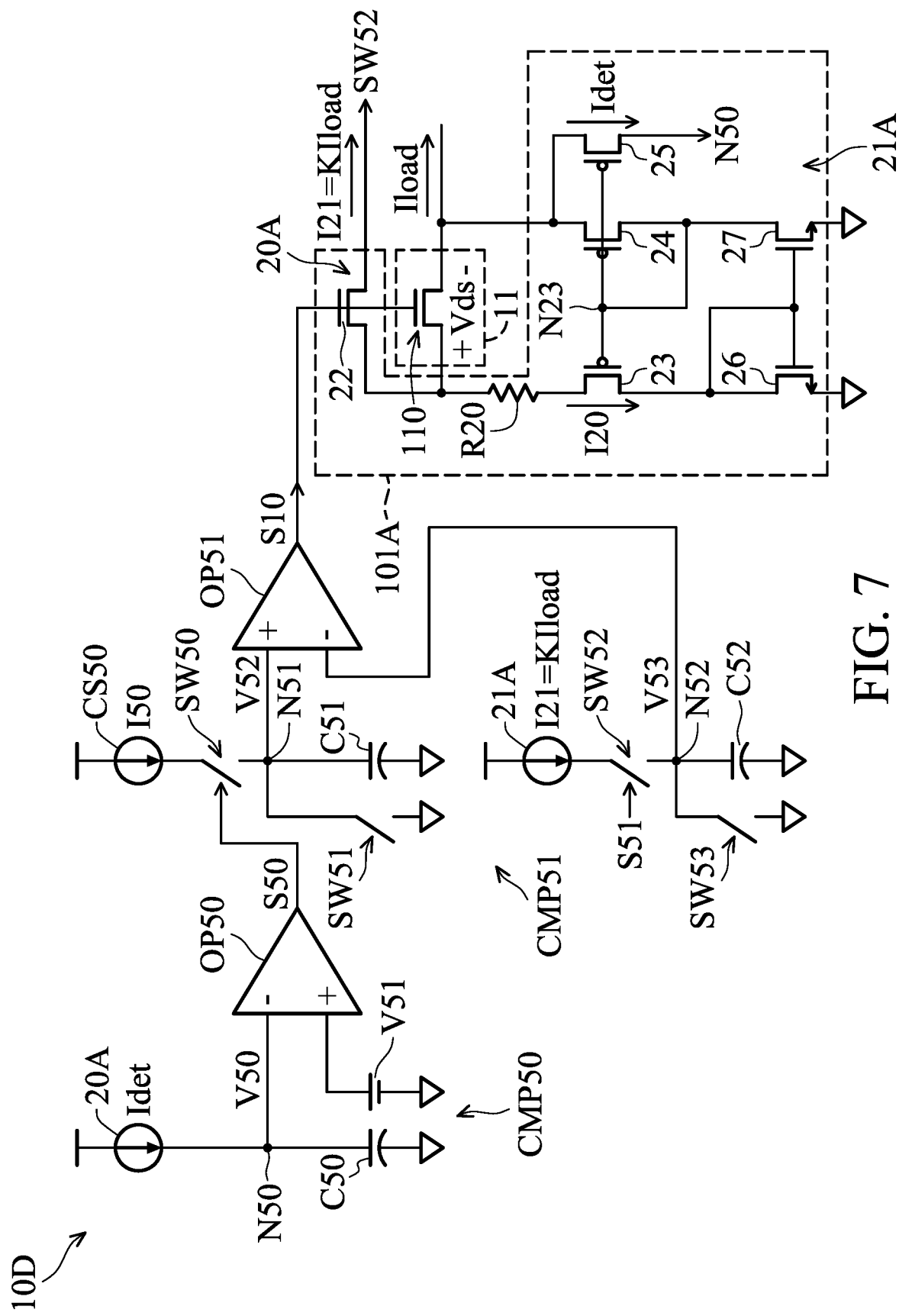
FIG. 7 shows a power limiting circuit according to another embodiment of the present invention.

FIG. 7 shows a power limiting circuit according to another embodiment of the present invention. The power limiting circuit 10 of FIG. 1 can be implemented by the power limiting circuit 10D of FIG. 7. The circuit structure of the power limiting circuit 10D is substantially the same as that of the power limiting circuit 10C in FIG. 5. The only difference between the power limiting circuits 10D and 10C is that the current I21 (a detection signal) generated by the current detection circuit 20A is provided to the comparison circuit CMP51 as an input signal of the control circuit 100B and the current Idet (another detection signal) generated by the voltage detection circuit 21A is provided to the node N50 of the comparison circuit CMP50 as another input signal of the control circuit 100B. The circuit structure and operation of the power limiting circuit 10D are as described in the embodiment of FIG. 5, and thus omitted here.

Figure 8:
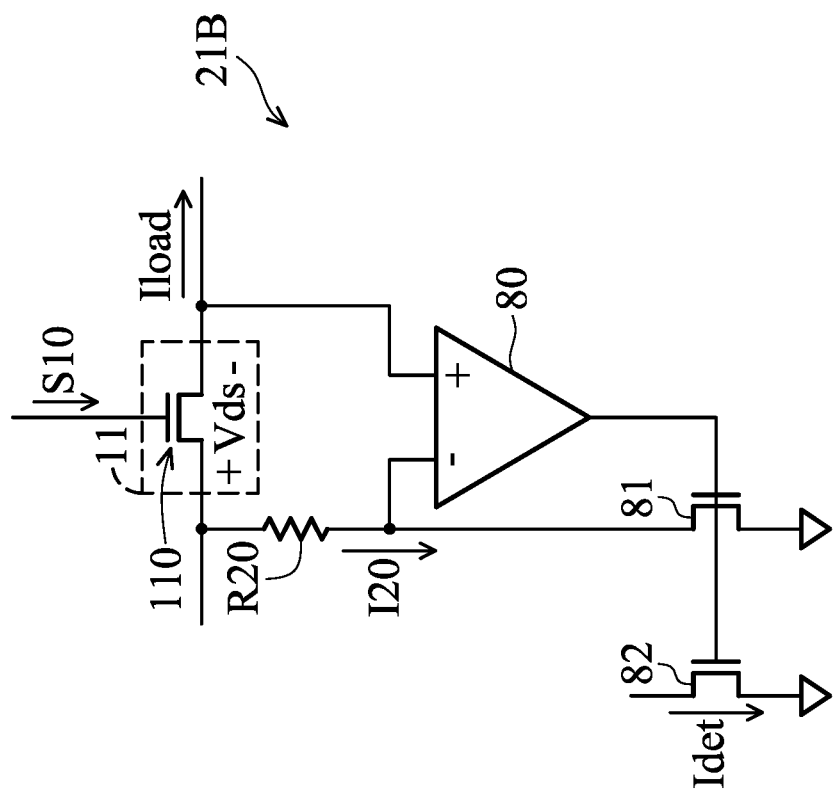
FIG. 8 shows a voltage detection circuit according to another embodiment of the present invention.

FIG. 8 shows a voltage detection circuit according to another embodiment of the present invention. Referring to FIG. 8, a voltage detection circuit 21B can replace the voltage detection circuit 21A in any one of FIGS. 2, 4, 5, and 7. Referring to FIG. 8, the voltage detection circuit 21B also comprises a resistor R20 and further comprises an operational amplifier 80 and NMOS transistors 81 and 82. The operational amplifier 80 has an inverting input terminal (−), a non-inverting input terminal (+), and an output terminal. The first terminal of the resistor R20 is coupled to the drain of the NMOS transistor 110, and the second terminal thereof is coupled to the inverting input terminal (−) of the operational amplifier 80. The non-inverting input terminal (+) of the operational amplifier 80 is coupled to the source of the NMOS transistor 110. The drain of the NMOS transistor 81 is coupled to the second terminal of the resistor R20 and the inverting input terminal (−) of the operational amplifier 80, the source thereof is coupled to the ground terminal, and the gate thereof is coupled to the output terminal of the operational amplifier 80. The gate of the NMOS transistor 82 is also coupled to the output terminal of the operational amplifier 80. When the electronic device operates, the voltage detection circuit 21B generates the current I20 (I20=Vds/r20) based on the resistance value r20 of the resistor R20 and the cross voltage Vds of the NMOS transistor 110. Through the operations of the operational amplifier 80 and the NMOS transistors 81 and 82 in the voltage detection circuit 21B, the mirrored current Idet of the current I20 is obtained.

Figure 9:
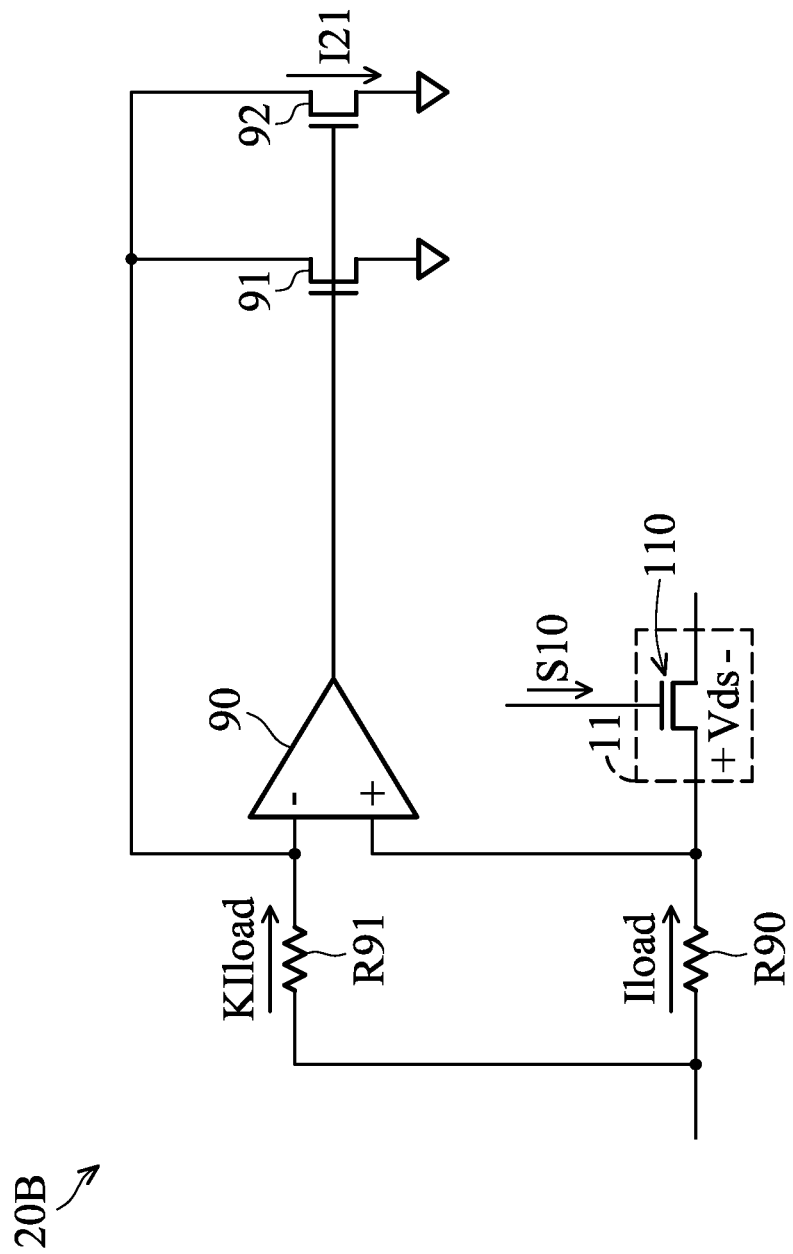
FIG. 9 shows a current detection circuit according to another embodiment of the present invention.

FIG. 9 shows a current detection circuit according to another embodiment of the present invention. Referring to FIG. 9, a current detection circuit 20B can replace the current detection circuit 20A in any one of FIGS. 2, 4, 5, and 7. Referring to FIG. 9, the voltage detection circuit 21B comprises resistors R90 and R91, an operational amplifier 90, and NMOS transistors 91 and 92. The operational amplifier 90 has an inverting input terminal (−), a non-inverting input terminal (+), and an output terminal. The first terminal of the resistor R90 is coupled to the drain of the NMOS transistor 110 and the non-inverting input terminal (+) of the operational amplifier 90. The first terminal of the resistor R91 is coupled to the second terminal of the resistor R90, and the second terminal thereof is coupled to the inverting input terminal (−) of the operational amplifier 90. The drain of the NMOS transistor 91 is coupled to the second terminal of the resistor R91 and the inverting input terminal (−) of the operational amplifier 90, the source thereof is coupled to the ground terminal, and the gate thereof is coupled to the output terminal of the operational amplifier 90. The drain of the NMOS transistor 92 is coupled to the second terminal of the resistor R91 and the inverting input terminal (−) of the operational amplifier 90, the source thereof is coupled to the ground terminal, and the gate thereof is coupled to the output terminal of the operational amplifier 90. In the embodiment, the resistance value of the resistor R91 is 1/K times the resistance value of the resistor R90. When the electronic device operates, the load current Iload flows through the resistor R90 and the NMOS transistor 110, and a current that is K times the load current Iload flows through the resistor R91. Through the operations of the operational amplifier 90 and the NMOS transistors 91 and 92, the current I21 that is equal to a predetermined multiple of the load current Iload is obtained.

According to the above various embodiments of the present invention, when the cross voltage between the input terminal and the output terminal of the power device increases, the operation power of the power limiting circuit can decrease to a predetermined value by shortening the time when the power device is enabled or turned on. The power limiting circuit of the present application does not affect the operation of the overcurrent protection circuit coupled to the power device. When the cross voltage between the input terminal and the output terminal of the power device is low or the operation power of the power device does not exceed the above-mentioned predetermined value, the overcurrent protection circuit can be used to achieve the overcurrent protection.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A current limiting circuit for controlling an operation power of a power device during operation, comprising:
   a detection circuit, coupled to the power device, configured to detect a cross voltage between an input terminal and an output terminal of the power device and generate at least one detection signal associated with the detected cross voltage; and a control circuit, coupled to the detection circuit and the power device, and configured to generate a control signal based on the at least one detection signal,
wherein the control circuit adjusts a duty cycle of the control signal based on the at least one detection signal to control the operation power of the power device;
wherein the at least one detection signal comprises a first detection signal representing the cross voltage and a second detection signal representing a load current flowing through the power device, and the operation power is determined based on the cross voltage and the load current;
wherein the control circuit receives one of the first detection signal and the second detection signal as a first input signal and receives the other of the first detection signal and the second detection signal as a second input signal; and
wherein the control circuit comprises:
a first comparison circuit configured to receive the first input signal to
generate a first input voltage and compare the first input voltage with a ramp voltage to generate a comparison signal; and
a second comparison circuit configured to receive the comparison signal
and the second input signal, wherein the second comparison circuit is controlled by the comparison signal to generate a second input voltage based on the second input signal and configured to compare the second input voltage with a reference voltage to generate the control signal,
wherein in response to increasing of the operation power, the first
comparison circuit increases a duty cycle of the comparison signal, and the second comparison circuit decreases a duty cycle of the control signal, so that the operation power of the power device decreases.

2. The current limiting circuit as claimed in claim 1, wherein the power device is a power metal-oxide-semiconductor (MOS) transistor, a gate of the power metal-oxide-semiconductor transistor receives the control signal, one first drain/source of the power metal-oxide-semiconductor transistor is the input terminal of the power device, and another first drain/source of the power metal-oxide-semiconductor transistor is the output terminal of the power device.

3. The current limiting circuit as claimed in claim 1, wherein the detection circuit comprises:
a voltage detection circuit, coupled between the input terminal and the output terminal of the power device, and configured to detect the cross voltage and generate the first detection signal based on the detected cross voltage; and
a current detection circuit, coupled to the input terminal of the power device, configured to detect the load current flowing through the power device and generate the second detection signal based on the detected load current, wherein the load current is generated based on the cross voltage.

4. The current limiting circuit as claimed in claim 1, wherein the first comparison circuit comprises:
a comparator having an inverting input terminal coupled to a first node, a non-inverting input terminal coupled to a second node, and an output terminal;
a capacitor coupled between the first node and a ground terminal;
a switch, coupled between the first node and the ground terminal;
a resistor coupled between the second node and the ground terminal; and
a current source coupled to the first node and configured to provide a first current to the first node,
wherein the first input signal is provided to the second node, and the first input voltage is generated at the second node, and
wherein the ramp voltage is generated at the first node, and the comparison signal is generated at the output terminal of the comparator.

5. The current limiting circuit as claimed in claim 1, wherein the second comparison circuit comprises:
a comparator having an inverting input terminal coupled to a first node, a non-inverting input terminal, and an output terminal;
a first switch, controlled by the comparison signal, and having an input terminal for receiving the second input signal and an output terminal coupled to the first node;
a capacitor coupled between the first node and a ground terminal; and
a second switch, coupled between the first node and the ground terminal,
wherein the second input voltage is generated at the first node, and the reference voltage is provided to the non-inverting input terminal of the comparator, and
wherein the control signal is generated at the output terminal of the comparator.

6. A current limiting circuit for controlling an operation power of a power device during operation, comprising:
a detection circuit, coupled to the power device, configured to detect a cross voltage between an input terminal and an output terminal of the power device and generate at least one detection signal associated with the detected cross voltage; and
a control circuit, coupled to the detection circuit and the power device, and configured to generate a control signal based on the at least one detection signal,
wherein the control signal is provided to enable or disable the power device to
control the operation power of the power device;
wherein the at least one detection signal comprises a first detection signal representing the cross voltage and a second detection signal representing a load current flowing through the power device, and the operation power is determined based on the cross voltage and the load current,
wherein the control circuit receives one of the first detection signal and the second detection signal as a first input signal and receives the other of the first detection signal and the second detection signal as a second input signal, and
wherein the control circuit comprises:
a first comparison circuit configured to receive the first input signal to generate a first input voltage, and compare the first input voltage with a first reference voltage to generate a comparison signal; and
a second comparison circuit configured to receive the comparison signal and the second input signal, wherein the second comparison circuit is controlled by the comparison signal to provide a second reference voltage, and the second comparison circuit is configured to generate a second input voltage based on the second input signal and compare the second input voltage with the second reference voltage to generate the control signal,
wherein in response to increasing of the operation power, the first comparison circuit increases a duty cycle of the comparison signal, and the second comparison circuit decreases the duty cycle of the control signal, so that the operation power of the power device decreases.

7. The current limiting circuit as claimed in claim 6, wherein the first comparison comprises:
- a comparator having an inverting input terminal coupled to a first node, a non-inverting input terminal receiving the first reference voltage, and an output terminal; and
- a capacitor coupled between the first node and a ground terminal,
- wherein the first input signal is provided to the first node, and the first input voltage is generated at the first node.

8. The current limiting circuit as claimed in claim 6, wherein the second comparison comprises:
- a comparator having a non-inverting input terminal coupled to a first node, an inverting input terminal coupled to a second node, and an output terminal;
- a current source providing a first current;
- a first switch controlled by the comparison signal and having an input terminal receiving the first current and an output terminal coupled to the first node;
- a first capacitor coupled between the first node and a ground terminal;
- a second switch coupled between the first node and the ground terminal;
- a third switch controlled by a switching signal and having an input terminal receiving the second input signal and an output terminal coupled to the second node;
- a second capacitor coupled between the second node and the ground terminal; and
- a fourth switch, coupled between the second node and the ground terminal,
- wherein the second reference voltage is generated at the first node, and the second input voltage is generated at the second node, and
- wherein the control signal is generated from the output terminal of the comparator.

9. The current limiting circuit as claimed in claim 1, wherein the detection circuit detects the cross voltage to generate the first detection signal and detects the load current flowing through the power device to generate the second detection signal.

\* \* \* \* \*